US009245082B2

(12) United States Patent
Birch

(10) Patent No.: US 9,245,082 B2
(45) Date of Patent: Jan. 26, 2016

(54) HIGH-SPEED SHAPE-BASED ROUTER

(75) Inventor: Jeremy Birch, Bristol (GB)

(73) Assignee: Pulsic Limited (GB)

(*) Notice: Subject to any disclaimer, the term of this patent is extended or adjusted under 35 U.S.C. 154(b) by 1866 days.

(21) Appl. No.: 11/425,504

(22) Filed: Jun. 21, 2006

(65) Prior Publication Data

US 2006/0288323 A1 Dec. 21, 2006

Related U.S. Application Data

(60) Provisional application No. 60/595,296, filed on Jun. 21, 2005.

(51) Int. Cl.
*G06F 17/50* (2006.01)

(52) U.S. Cl.
CPC .................................. *G06F 17/5077* (2013.01)

(58) Field of Classification Search
CPC .................................................. G06F 17/5077
USPC ............................................... 716/10, 12–14
See application file for complete search history.

(56) References Cited

U.S. PATENT DOCUMENTS

| | | | | |
|---|---|---|---|---|
| 3,621,208 | A | * | 11/1971 | Isett et al. ..................... 716/12 |
| 4,613,941 | A | | 9/1986 | Smith et al. |
| 4,615,011 | A | | 9/1986 | Linsker |
| 4,673,966 | A | | 6/1987 | Shimoyama |
| 4,777,606 | A | | 10/1988 | Fournier |
| 4,782,193 | A | | 11/1988 | Linsker |
| 4,811,237 | A | | 3/1989 | Putatunda et al. |
| 4,815,003 | A | | 3/1989 | Putatunda et al. |
| 4,835,705 | A | | 5/1989 | Fujino |
| 4,855,253 | A | | 8/1989 | Weber |
| 4,888,299 | A | * | 12/1989 | Shiraishi et al. ................ 716/12 |
| 4,965,739 | A | | 10/1990 | Ng et al. |
| 5,072,402 | A | | 12/1991 | Ashtaputre et al. |
| 5,272,645 | A | | 12/1993 | Kawakami et al. |
| 5,353,235 | A | | 10/1994 | Do et al. |
| 5,375,069 | A | | 12/1994 | Satoh et al. |
| 5,500,804 | A | | 3/1996 | Honsinger et al. |
| 5,541,005 | A | | 7/1996 | Bezama et al. |
| 5,550,748 | A | | 8/1996 | Xiong |
| 5,635,736 | A | | 6/1997 | Funaki et al. |
| 5,637,920 | A | | 6/1997 | Loo |
| 5,640,327 | A | | 6/1997 | Ting |

(Continued)

FOREIGN PATENT DOCUMENTS

WO 96/24904 A 8/1996

OTHER PUBLICATIONS

Finch, A.C., et al., "A Method for Gridless Routing of Printed Circuit Boards," IEEE, 22nd Design Automation Conference, 1985, pp. 509-515, Paper 32.2.

(Continued)

*Primary Examiner* — Nha Nguyen
(74) *Attorney, Agent, or Firm* — Aka Chan LLP

(57) ABSTRACT

A high-speed shape-based router is applicable to standard-cell digital designs, chip-level-block assembly designs, and other styles of design. In a flow of the invention, the technique establishes an initial structure for each net to be routed. Nets or parts of them are ordered. Each part of the net may be routed using a spine routing search, depth first search, or a space flood search, or any combination of these. Where sections fail or an error occurs, conflicts are identified, and the technique tries routing again.

31 Claims, 15 Drawing Sheets

(56) References Cited

U.S. PATENT DOCUMENTS

| | | | |
|---|---|---|---|
| 5,646,830 A | 7/1997 | Nagano | |
| 5,650,653 A | 7/1997 | Rostoker et al. | |
| 5,673,201 A | 9/1997 | Malm et al. | |
| 5,689,433 A | 11/1997 | Edwards | |
| 5,723,908 A | 3/1998 | Fuchida et al. | |
| 5,757,089 A | 5/1998 | Ishizuka | |
| 5,784,289 A | 7/1998 | Wang | |
| 5,790,414 A * | 8/1998 | Okano et al. | 716/13 |
| 5,801,385 A | 9/1998 | Endo et al. | |
| 5,801,959 A | 9/1998 | Ding et al. | |
| 5,811,863 A | 9/1998 | Rostoker et al. | |
| 5,822,214 A | 10/1998 | Rostoker et al. | |
| 5,856,927 A | 1/1999 | Greidinger et al. | |
| 5,880,969 A | 3/1999 | Hama et al. | |
| 5,889,329 A | 3/1999 | Rostoker et al. | |
| 5,980,093 A | 11/1999 | Jones et al. | |
| 6,111,756 A | 8/2000 | Moresco | |
| 6,150,193 A | 11/2000 | Glenn | |
| 6,219,823 B1 | 4/2001 | Hama et al. | |
| 6,260,183 B1 | 7/2001 | Raspopovic et al. | |
| 6,262,487 B1 | 7/2001 | Igarashi et al. | |
| 6,263,475 B1 | 7/2001 | Toyonaga et al. | |
| 6,282,693 B1 | 8/2001 | Naylor et al. | |
| 6,301,686 B1 | 10/2001 | Kikuchi et al. | |
| 6,301,693 B1 | 10/2001 | Naylor et al. | |
| 6,307,256 B1 | 10/2001 | Chiang et al. | |
| 6,316,838 B1 | 11/2001 | Ozawa et al. | |
| 6,323,097 B1 | 11/2001 | Wu et al. | |
| 6,324,674 B2 | 11/2001 | Andreev et al. | |
| 6,324,675 B1 | 11/2001 | Dutta et al. | |
| 6,349,403 B1 | 2/2002 | Dutta et al. | |
| 6,353,918 B1 * | 3/2002 | Carothers et al. | 716/129 |
| 6,401,234 B1 * | 6/2002 | Alpert et al. | 716/129 |
| 6,408,427 B1 | 6/2002 | Cong et al. | |
| 6,412,097 B1 | 6/2002 | Kikuchi et al. | |
| 6,448,591 B1 | 9/2002 | Juengling | |
| 6,480,993 B1 | 11/2002 | Suto et al. | |
| 6,480,996 B1 | 11/2002 | Aji et al. | |
| 6,507,941 B1 | 1/2003 | Leung et al. | |
| 6,510,545 B1 | 1/2003 | Yee et al. | |
| 6,516,455 B1 | 2/2003 | Teig et al. | |
| 6,526,555 B1 | 2/2003 | Teig et al. | |
| 6,543,043 B1 | 4/2003 | Wang et al. | |
| 6,564,366 B1 | 5/2003 | Marchenko et al. | |
| 6,598,215 B2 | 7/2003 | Das et al. | |
| 6,645,842 B2 | 11/2003 | Igarashi et al. | |
| 6,662,348 B1 | 12/2003 | Naylor et al. | |
| 6,671,859 B1 | 12/2003 | Naylor et al. | |
| 6,711,727 B1 | 3/2004 | Teig et al. | |
| 6,734,472 B2 | 5/2004 | Ho | |
| 6,804,810 B1 * | 10/2004 | Petersen et al. | 716/12 |
| 6,895,567 B1 | 5/2005 | Teig et al. | |
| 7,065,729 B1 * | 6/2006 | Chapman | 716/13 |
| 7,257,797 B1 * | 8/2007 | Waller et al. | 716/14 |
| 7,506,289 B1 * | 3/2009 | Chapman | 716/5 |
| 2001/0004763 A1 | 6/2001 | Kato | |
| 2001/0009031 A1 * | 7/2001 | Nitta et al. | 716/13 |
| 2001/0018759 A1 * | 8/2001 | Andreev et al. | 716/7 |
| 2002/0069397 A1 | 6/2002 | Teig et al. | |
| 2002/0144227 A1 * | 10/2002 | Das et al. | 716/12 |
| 2003/0025205 A1 | 2/2003 | Shively | |
| 2003/0051217 A1 * | 3/2003 | Cheng | 716/5 |
| 2003/0115566 A1 * | 6/2003 | Teig | 716/14 |
| 2004/0044979 A1 * | 3/2004 | Aji et al. | 716/13 |
| 2004/0103387 A1 * | 5/2004 | Teig et al. | 716/13 |
| 2005/0138578 A1 * | 6/2005 | Alpert et al. | 716/2 |
| 2006/0294488 A1 | 12/2006 | Waller | |

OTHER PUBLICATIONS

Staepelaere et al., "Surf: A Rubber-Band Routing System for Multichip Modules", IEEE Design & Test of Computers, IEEE Service Center, New York, NY, US, vol. 10, No. 4, Dec. 1, 1993, pp. 18-26.

Mo et al., "Fishbone: A block-level placement and routing scheme", Proceedings of the International Symposium on Physical Design, 2003, pp. 204-209.

Linsker et al., "An iterative-improvement penalty-function-driven wire routing system", IBM Journal of Research and Development, International Business Machines Corporation, New York, vol. 28., No. 5, Sep. 1984, pp. 613-624.

Dayan, "Rubber-Band Based Topological Router", http://www.cse.ucsc.edu/research/surf/papers/talsDissertation.pdf, Jun. 1997.

Cohoon et al., "Critical net routing", Proceedings of the International Conference on Computer Design—VLSI in Computers and Processors, Cambridge, MA, Oct. 14-16, 1991, pp. 174-177.

Kahing et al, "A New Class of Iterative Steiner Three Heuristics with Good Performance", IEEE Transactions on Computer Aided Design of Integrated Circuits and Systems, IEEE Service Center, Piscataway, N.J., vol. 11, No. 7, Jul. 1, 1992, pp. 893-902.

Bozorgzadeh et al., "Creating and Exploiting Flexibility in Rectilinear Steiner Trees", IEEE Transactions on Computer Aided Design of Integrated Circuits and Systems, IEEE Service Center, Piscataway, N.J., vol. 22, No. 5, May 2003, pp. 605-615.

Horowitz et al., "Exercises", Computer Algorithms, Computer Science Press, New York, U.S., 1998, pp. 241-275.

* cited by examiner

HIGH-SPEED SHAPE-BASED ROUTER

CROSS-REFERENCE TO RELATED APPLICATION

This patent application claims the benefit of U.S. provisional patent application 60/595,296, filed Jun. 21, 2005, which is incorporated by reference along with all other references cited in this application.

BACKGROUND OF THE INVENTION

The present invention relates to the field of electronic design automation for integrated circuits, and in particular, to the area of high-speed automatic routing of nets using a shape-based approach.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire to for higher integration and better performance in integrated circuits.

Within an integrated circuit, there are devices, such as transistors, and interconnect. Interconnect is used to connect signals between the circuitry and also to supply power to the circuitry. Interconnect may include metal lines, polysilicon lines, polysilicide lines, or other conductive materials. Interconnect is also sometimes referred to as nets. There may be more than one layer of interconnect, such as metal-1 and metal-2 layers. There is a need for a technique of automatically routing the interconnect of an integrated circuit. Automatic routing will automatically connect the inputs of particular devices, circuits, or cells to the appropriate inputs, typically from other circuits, devices, or cells, or from the pins of those devices or cells.

Therefore, there is a need for improved techniques in automatic routing, especially using a high-speed shape-based automatic routing approach.

BRIEF SUMMARY OF THE INVENTION

The invention provides a high-speed shape-based router system. The high-speed shape-based router is applicable to standard-cell digital designs, chip-level-block assembly designs, and other styles of design. In a flow of the invention, the technique establishes an initial structure for each net to be routed. Nets or parts of them are ordered. Each part of the net may be routed using a spine routing search, depth first search, or a space flood search, or any combination of these. Where sections fail or an error occurs, conflicts are identified, and the technique tries routing again.

An implementation of the invention uses Steiner decomposition and a join router. Further implementations of the invention may use other join routers. A spine search, a depth first search, or a space flood search, or a combination of these may be used. Multiple engines may be provided to implement the join routes and more than one of these engines may be used complete an individual join.

In an implementation, the invention is a method including establishing an initial structure for nets to be routed; ordering the nets or portions of the nets; routing each part of the net using a spine routing search; and for sections which fail or have an error, identifying a conflict and rerouting. A Steiner point may be placed in the initial structure. When there are n pins are to be routed, where n is an integer two or greater, there will be at least n−1 routing problems to be solved. An order for solving the at least n−1 routing problems is determined.

The method may include sorting the at least n−1 routing problems according to distance in a first dimension, and solving one of the at least n−1 routing problems with a longest distance in the first dimension before other routing problems. The method may include determining a spine segment for two pins or Steiner points to be routed, connecting the two pins or Steiner points to the spine segment using two subspine segments, where the spine segment may be longer than either of the two subspines segments. The result of the routing each part of the net using a spine routing search is a route that includes at most three segments to connect every two pins. In an implementation, the spine segment is on a first layer conductor and the subspine segments are on a second layer conductor, different from the first layer conductor.

In another implementation, the invention is a method including: providing a layout with at least three pins to be coupled together using a net; adding a Steiner point to the layout; determining a path between the Steiner point and a first pin of the at least three pins; determining a path between the Steiner point and a second pin of the at least three pins; and determining a path between the Steiner point and a third pin of the at least three pins.

In another implementation, the invention is a shape-based routing method including: providing n pins of a layout to be routing using a net, where n is an integer two or greater; determining whether to add and adding at least one Steiner point to the layout; decomposing the net into at least n−1 routing problems to be solved; determining an order to solve the routing problems; solving to the routing problems in the order determined; and finding the net coupling the n pins together.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
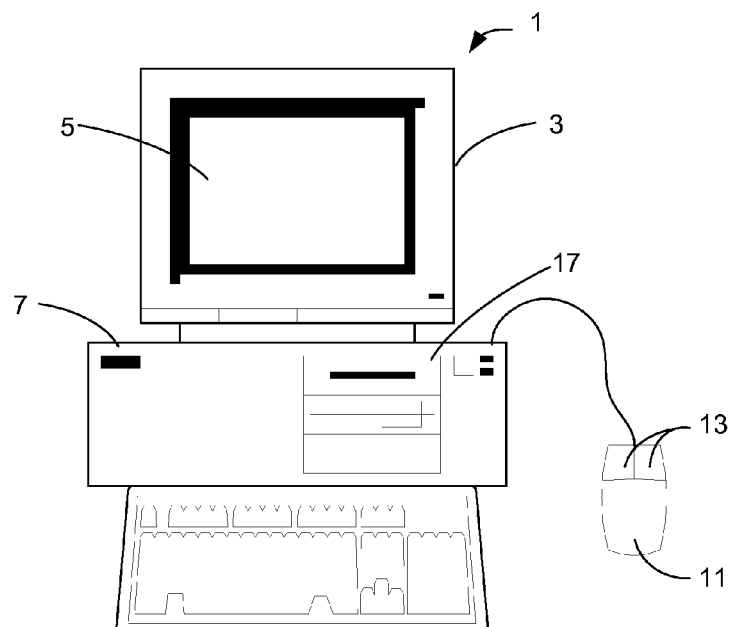
FIG. 1 shows a system of the present invention for performing electronic circuit design, including automatic routing of nets of an integrated circuit.

FIG. 1 shows an electronic design automation (EDA) system of the present invention for designing an electronic circuit or integrated circuit, including automatic routing of nets of the circuit. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like.

Mass storage devices 17 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

A computer-implemented version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 17. The source code of the software of the present invention may also be stored or reside on mass storage device 17 (e.g., hard disk, magnetic disk, tape, or CD-ROM). As a further example, code of the invention may be transmitted via wires, radio waves, or through a network such as the Internet.

Figure 2:
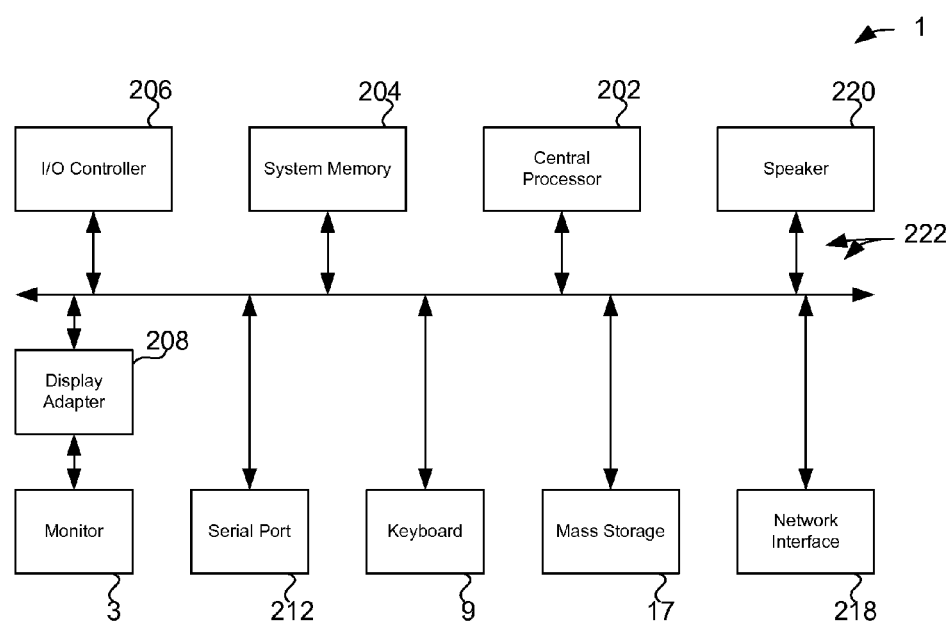
FIG. 2 shows a simplified system block diagram of computer system used to execute a software implementation of the present invention.

FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory. The processor may be a dual core or multicore processor, where there are multiple processor cores on a single integrated circuit. The system may also be part of a distributed computing environment.

Arrows such as 222 represent the system bus architecture of computer system 1. However, these arrows are illustrative of any interconnection scheme serving to link the subsystems. For example, speaker 220 could be connected to the other subsystems through a port or have an internal direct connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, C#, Pascal, Fortran, Perl, MatLab (from MathWorks, www.mathworks.com), SAS, SPSS, Java, JavaScript, and AJAX. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems).

An operating system for the system may be one of the Microsoft Windows® family of operating systems (e.g., Windows 95, 98, Me, Windows NT, Windows 2000, Windows XP), Linux, HPUX, UNIX, or Sun OS. Other operating systems may be used. Other operating systems may be used. A computer in a distributed computing environment may use a different operating system from other computers.

Furthermore, the computer may be connected to a network and may interface to other computers using this network. For example, each computer in the network may perform part of the task of the many series of automatic routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

Figure 3:
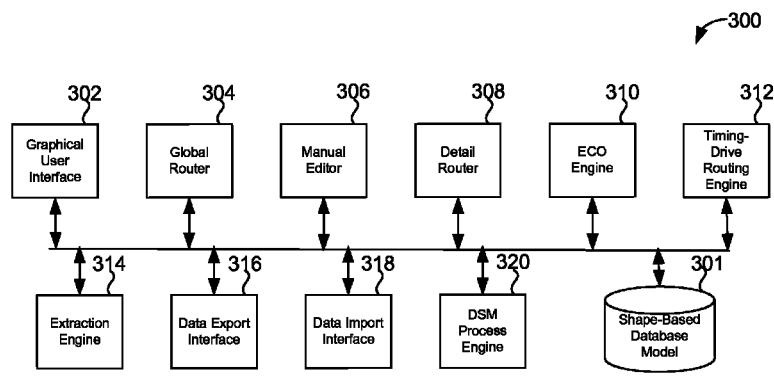
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change option (ECO) engine 310, timing-driven routing engine 312, extraction engine 314, data export interface 318, and DSM process engine 320. An EDA system may include any number of the system tools shown in FIG. 3, and in any combination. Further, the EDA system may include additional tools not shown in FIG. 3.

An EDA system may be a grid-based system or shape-based system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation.

The shape may be representative of any polygon. For example, the shape may be a rectangle. The shape may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used such as 30 degrees, 35 degrees, 36 degrees, 42 degrees, 45 degrees, or 60 degrees) turns as needed to route around the obstacle.

Chip design, be it analog, custom, or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design.

The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip up and reroute techniques. Gridded systems are not good at irregular intervals, irregular spacings, or routing things that do not fit onto a regular grid.

The gridless approach easily handles off-grid connections and is efficient for post-route optimizations. In a shape-based or gridless system, the layout may be a gridless layout, which means there is no grid which structures or polygon of the layout are associated with, other than a grid for the relevant manufacturing process, if any.

In an embodiment, the structure of database 301 facilitates shape-based operations. For example, a structure of this database may include an obstacle tree having nodes and leaves containing the obstacles of an integrated circuit. This tree structure permits rapid determination of where obstacles are when doing operations on the database, such as routing nets.

In FIG. 3, the EDA system 300 includes one or more of the components discussed below, in any combination. One skilled in the art will recognize that one or more of components shown in FIG. 3 may not be required to practice specific aspects of present invention. For example, when ECO engine is omitted from system, the system could still perform automatic routing of interconnect, but not be able to perform incremental netlist changes upon it.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that coarsely routes interconnects of the integrated circuit, thus enabling large designs to be routed more rapidly and completely. The global router may also provide visual and quantitative analysis of the congestion in the design by highlighting problem areas that can be fixed by incremental adjustments to the floor plan. The global router is sometimes referred to as a coarse router because it provides generally the routes for the interconnect, and may work in conjunction with a detail router 308 (discussed below) to place the geometries of the interconnect. It may make global analyses of capacity and demand, or just give ideal paths for each net, or a combination of both.

A manual editor 306 is a shape-editing suite for creating or editing metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Powerful tools automatically push-aside existing wiring to make way for new wires and semiautomatic routing tools quickly close down troublesome nets by allowing the user to guide the routing engine around complex areas of the design.

The detail router 308 is an automatic router that completes the wiring in a design by determining the specific routes for each interconnect. The detail router may complete a portion of the wiring for design, such as for sections or specified cells of the design, or may complete all the wiring of the design. The detail router may route starting from scratch or from partially completed routing. In an implementation, the global router determines the general route paths for the interconnect. The detail router takes this routing information from the global router and puts in the physical detailed geometries of the tracks and vias, deviating to some extent from the paths suggested by the global routing stage.

An engineering change order (ECO) engine 310 provides a capability to handle late stage ECO changes. Every element of the design can be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides RC timing analysis of interconnects. Used in concert with the detail router, the timing engine can determine the path of least delay for critical nets. Furthermore, the timing engine, in concert with an extraction engine, can actively select a longer path with a lower associated delay (e.g., due to lower capacitance) in preference to a shorter but slower route.

An extraction engine 314 is provided. Utilizing a unified, high-speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed. More details are discuss in U.S. patent application Ser. Nos. 10/709,843 and 10/709,844, both filed Jun. 1, 2004 and incorporated by reference.

In a specific embodiment, an RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis which ensures tolerance to manufacturing variations.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool to which it is being exported.

A data import interface 318 provides the means to import data, such as a circuit layout, netlist, or design constraints. The data to be import may be in various formats including data saved from other EDA systems or software tools. In addition, the source of the data may be a database, floppy drive, flash drive, tape, hard disk drive, CD-ROM, CD-R, CD-RW, DVD, or a device over a communication network. Some examples of import formats include text, ASCII, GDSII, Verilog, SIF, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A silicon interface format 322 is provided, which in a specific implementation is an ASCII database format. However, in other implementations, other silicon interface formats may be used.

A user may design an integrated circuit using a system such as shown in FIG. 3. A representative flow for designing an integrated circuit is outlined in steps 1 to 8 below. Step 5 is further subdivided into three substeps.

Integrated Circuit Design Flow
1. Provide Circuit Specification
2. Create Circuit Design
3. Generate Netlist
4. Simulate Performance and Verify Functionality of Circuit Design
5. Generate Layout
  5a. Layout Devices
  5b. Connect Devices
  5c. Connect Blocks of Circuitry
6. Physical Verification and Design Checking
7. Create Masks
8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout can be back-annotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are sets of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the components of the devices and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layers. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6, after or while the layout is generated, the physical design is verified and checked. For example, some of these operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII or other format) that is used to make the masks (step 7). The masks are used to fabricate the integrated circuit (step 8) using a photolithography process. Typically, there are many "copies" of the same integrated circuited fabricated on the same wafer. Each integrated circuit is a "die" on the wafer. A good die is a die which is fully functional and also have to satisfy certain desired performance specifications. A good die is separated from the others, and sawed and packaged. Packaging generally includes encapsulating the die in plastic or other material, and connecting pads of the integrated circuit to pins of the package, where the integrated circuit can be interfaced.

Shape-based routers are traditionally used for particular styles of designs, where there are relatively few layers of interconnect available, where extreme aspect ratios of floor plan are used, or where electrical, yield or other considerations require a higher level of control over the detail of the interconnect. Shape-based routes have generally not been used in situations such as large, flat, digital designs, which are common in application specific integrated circuits (ASICs) due to memory and performance issues of shape-based routers in this situation.

This invention provides novel ways to deliver the same benefits of shape-based routing, while being of comparable performance to the best ASIC routers.

Figure 4:
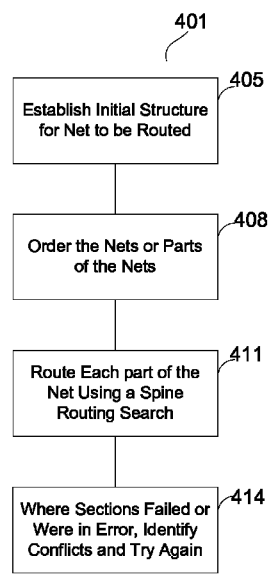
FIG. 4 shows a flow diagram of an embodiment of the invention.

FIG. 4 shows a flow diagram 401 of a technique the invention. In a step 405, the technique establishes an initial structure for each net to be routed. In a step 408, the technique orders the nets or parts of them. In a step 411, the technique routes each part of the net using the spine routing search or other shape-based search. In a step 414, the technique for where sections failed or were in error, identifies conflicts and tries again.

Note that references to X and Y or "orthogonal" are specifics of a more general case. So for instance, a design might allow routing on grid lines at multiples of 45 degrees from the positive X-axis and the same algorithm can be applied with the relevant modifications to such basis.

Spine routing is discussed in U.S. provisional patent application 60/577,850, filed Jun. 7, 2004 and U.S. patent application Ser. No. 10/908,895, filed May 31, 2005, both of which are incorporated by reference along with all other references cited in this application.

Below is more detail for or each of these steps in the flow of FIG. 4.

For step 405, regarding the initial structure:

(a) The pins (or other preexisting geometries) of the net are analyzed and a point, line, or rectangle is chosen that represents where the router is to join in each case.

(b) A Steiner or other similar minimum spanning tree algorithm is used to establish the connection pattern to be used, optionally adding extra points which will reduce the overall connection lengths, or deliver other desirable characteristics (e.g., structuring the net rooted at its electrical source so that timing and current characteristics can be controlled). In the cases, the structure should be made from sections relevant to the later searches, which may mean that the sections lie along edges of an X-Y grid, which can be achieved by the insertion of extra vertices in otherwise diagonal edges. The tool may choose to move such Steiner points if they lie within unreachable areas of the floor plan, for instance within an obstacle, in which case the new position may be discarded or the rest of the added points reevaluated on the basis of the new position of the moved point.

(c) In standard cell or similar designs where most pins are on the lowest metal layer and generally surrounded by the same metal, then these pins may be projected onto the next free routing layer, potentially by finding a legal position to insert a via on or near the pin, and then the other end of these vias become the "pins" that the rest of the algorithm tries to join.

For step 408, regarding the order of the nets:

(a) The structure of each net is measured, and the nets are then ordered by the longest X or Y section within the structure.

(b) OR the individual net sections are ordered by their length, with X and Y sections potentially being separated into two lists that are independently sorted.

(c) OR the nets are sorted by the larger dimension of their bounding boxes, OR by other criteria to do with criticality, OR a weighted combination of two or more of these criteria.

Ordering the nets gives the routes that have the least chance of successfully routing the initial chances to route. This increases the probability for routing success.

For step 411, regarding route each part:

(a) For pin-to-pin or pin-to-Steiner-point joining sections that lie along a basis grid line (for instance are parallel to the X- or Y-axis) a set of three overlapping initial prototype sites are created, with different cost functions. The first site encloses the direct line with a distance on each side sufficient to enclose between one and three tracks, and has a cost related only to the layer cost and the length of the direct line. Two other sites are created, one to either side of the direct line and potentially overlapping the first prototype site, with the far side being either the edge of the design or some nearer point, with a cost function that is at least equal to that of the first site plus the anticipated cost of the additional vias, and the cost grows the further from the direct line (b) For sections where the points do not lie on a common basis grid line (e.g., they are diagonal to each other on an X-Y grid) then a different set of prototype sites are produced, with minimum cost sites along the edge of the bounding box of the points to be joined, a higher but fixed cost within the box (reflecting the extra via to produce a Z shape than an L shape when strictly biased), and sites outside the bounding box with rising costs the further from the box the site is.

(c) The sites are extended along the line in order to take into account various routing restrictions, such as end-of-line extensions, minimum metal areas, minimum step sizes, and so forth, thus only fully legal sites will be found and extra modification of neighboring tracks will not be necessary.

(d) A cost-prioritized geographical search is performed on the list of sites, each obstacle being used to modify the overlapping site, either shrinking it across the direction of travel, or splitting it into two or more smaller sites. When a site shrinks below the required size to contain a track or via, or both, then it is disposed of.

(e) If vias are wider than wires, or if the spacings they require are greater, then they may become the limiting factor in the site. The search will only be sensitive to the extra requirements of the via at the ends of the sections, so that sites can be effectively narrower in the middle than at their ends.

(f) The first or lowest cost site that is large enough to carry a track or via, or both, and is known clear of obstacles is accepted.

(g) In the cases where joins may require two or more sections of track, then a set of accepted sites is required that can be strung together to join the end points. Typically a first acceptable site will be found that covers the span of the bounding box of the points to be joined in one direction or another, the remaining site searches are then restricted to try to join that site to the end points. This may involve creating extra initial sites if full-width sites cannot be found (i.e., ones that cross the whole bounding box). For instance if the first site found crosses the top edge of the box, and the second site found crosses the height of the box but some distance in from the right hand side, then there remains a need to find a new site that joins the vertical line to the bottom right hand corner. When sites cross, then they are trimmed back so that they meet at their ends.

(f) Once the site is finalized, the relevant tracks and vias are inserted.

(g) If this technique fails to reach all of the pins, then the existing autorouting function can be invoked to do the final joins, but possibly using restricted searches within the bounding boxes of the items to be joined.

(h) Once a section has been routed, the vertices, lines, or rectangles of the route can be added to the Steiner tree and the tree incrementally optimized to potentially reduce the remaining connections lengths.

(i) The above will run simultaneously on sites on multiple layers, allowing the creation of solutions using any pair of adjacent or nonadjacent layers, where each layer may have its own costs, spacing, and other rules.

(j) Where spacing rules vary by parallel length, it may be found sensible to place long tracks on alternating "pitches" (i.e., not at minimum spacing to each other but leaving space for short tracks in between), this will also help reduce problems with crosstalk, and so forth, while minimizing resource usage.

(k) At all times the nearest part of the wiring to each pin is recorded, and this can then be used to estimate the parasitics and other characteristics of the net even when it is incompletely wired.

(l) Data can be maintained to show which areas have high costs (due to sections only being routable at a large distance from their ideal line) and which areas have fails and errors. This information can be used to drive congestion driven algorithms such as placement and floor planning, or to regenerate the Steiner trees.

For step 411, regarding where sections fail:

(a) For sections where a free site is not found or where the cost is unacceptably high, the section search may be repeated looking for the site with the lowest level of conflicts, and the tracks inserted at that point whilst removing or moving the existing wiring. This can be selective in that wires used to create direct X or Y joins are more expensive to remove than ones that form one section of an indirect (Z shaped) join within the bounding box of their pins.

(b) Sections that are ripped out will get scheduled for routing in subsequent passes.

(c) If a search fails on a left to right sweep through a net (if all of a net is being routed at once) then it can be retried sweeping in the opposite direction, or in a random order. This is also true for joining points that are diagonal to each other.

Figure 5:
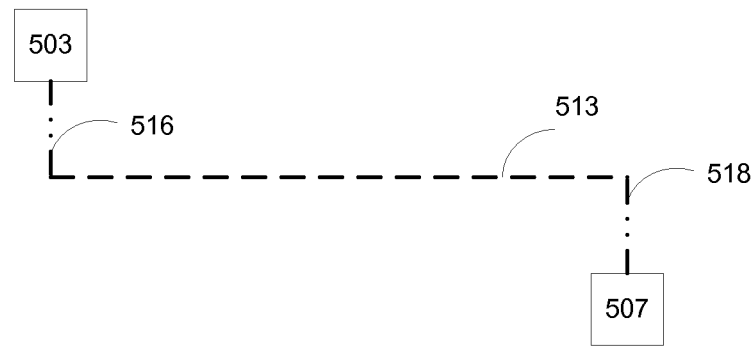
FIG. 5 shows a routing of two pins.

FIG. 5 shows an example of two pins (or points or locations) 503 and 507 to be routed together. Using an approach of the invention, a Steiner or other similar minimum spanning tree algorithm is used to establish the connection pattern to be used. In this case, no extra points or pins are added. A spine 513 is placed. Then two subspines 516 and 518 are generated to connect the spine to the pins. If this route placement is legal, this will be the route solution for the pins. If the route placement is not legal, the route is ripped up and rerouted, which means another route is tested. The algorithm creates legal paths or ones that are known to be illegal against known other nets that are possible to reroute.

So, when connecting two pins using a spine routing approach of the invention, generally, a spine is generated, and two subspines are generated that connect the points to the spine. There will be three segments. In a specific implementation, there will be a maximum of three segments to connect two points. In the FIG. 5 example there are three segments. However, depending on the positioning of pins and the spine, based on the costing algorithm, there may be two segments or even one segment. The longest segment of each route is routed first. Therefore, the initial spine will be longest segment of the three-segment route. Where the subspines do not reach the desired endpoints, then the remaining gap is issued as a new join that needs to be routed.

Figure 6:
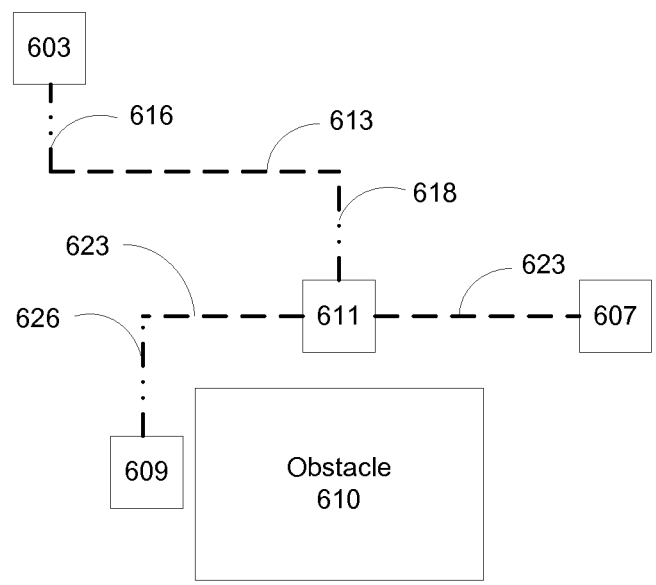
FIG. 6 shows a routing of three pins, where a Steiner point has been added.

FIG. 6 shows an example of three pins 603, 607, and 609 to be routed together. There is an obstacle 610. As discussed, when there are more than two points, these routing situations may be decomposed into multiple two-point routing problems that may be solved using a spine routing approach of the invention. When there are n pins, where n is an integer two or greater, there will be at least n−1 problems to solve. For example, for three pins, there will be at least two problems. For four pins, there will be at least three problems to solve.

In particular, according to an approach of the invention (see step 405 above), a location for a Steiner point is determined and placed. In this case, the algorithm determines a position for a Steiner point 611. Then the routing problem of the three pins is divided into three separate routing problems: (i) pin 603 to 611, (ii) pin 607 to 611, and (iii) pin 609 to 611.

The three problems may be solved using an appropriate order (see step 408 above). In this case, if the algorithm determines the route between 603 and 611 is, of the three routes, the more difficult route to determine, this problem will be solved first. Then the route between 609 and 611 will be determined, and finally the route between 607 and 611 will be determined.

For the route between 603 and 611, there will be a spine 613 and two subspines 616 and 618. For the route between 609 and 611, there will be a spine 623 and one subspine 627. The obstacle limits the legal routes for spine 623. For the route between 607 and 611, there is a spine 623. Subspines are not needed.

If all the routes are legal, then the three pins are connected using a route path determined by the technique. As can be seen, the paths intersect at the Steiner point. In some implementations of the invention. The paths will interest at the Steiner point, or at a point near, or as near a point, as is possible to the Steiner point. If the routes are not legal, the routes are ripped up and rerouted. A different position for the Steiner point may be found.

The approach of the invention provides faster routing of locations in a layout because bounds are placed on the search for an appropriate route. In contrast, a general router takes a great deal of computing time to search and compute a route.

In a specific embodiment, the invention provides a fast shape-based routing framework having the following flow:

(1) Each net is prestructured using Steiner or some similar mechanism.

(2) Congestion is analyzed from this.

(3) Nets are restructured to avoid congestion where necessary (e.g., costing input to the Steiner mechanism).

The above three steps 1-3 could be replaced by global routing.

(4) Structures are decomposed into point-to-point (or optionally line to line or area to area) joins from their structures.

(5) Joins are ordered according to length (i.e., longest ones first), or some other metric.

(6) Joins are dispatched to the join router.

(7) Parts of joins that cannot complete legally are rescheduled as smaller joins.

(8) Rip up and reroute is enabled optionally by allowing some joins to complete consciously in error and later on ripping up the removable objects that they violate against, (thus creating new joins in other nets that will subsequently need to be routed).

A "join" is a point-to-point (or line-to-line or area-to-area) disconnection that is to be routed in order to more fully complete the electrical connectivity of the net. This is often represented as a flight-line or connection line in a rats-nest image of the net.

In a specific embodiment, the invention provides a shape-based "join router" based on spine routing having the following flow. This is an embodiment of the join router.

(1) Joins that are between two vertically aligned or horizontally aligned points use the spine site finding algorithm varied so the cost is lowest along the direct line, steps up off the line to represent extra vias and rises linearly away from the line to represent extra track length that will be needed in the orthogonal direction to join the ends of site to the desired end points of the "join."

(2) Site solutions are only accepted if the cover the whole span between the end points in the dimension in which the original join ends differed.

(3) Joins that are between two diagonally offset points seek first a site covering the major axis (larger dimension) of the diagonal, and this is costed lowest if it lies along the edge of the enclosing rectangle of the end points, its cost steps up inside the rectangle to represent the extra vias but otherwise remains constant across the rectangle, and steps up outside the rectangle to represent extra vias and rises linearly away from it to represent orthogonal extra track that will be needed to join the site to the end points. Only sites that cover the whole major axis are accepted.

(4) Once a major axis site has been found then one or two minor axis sites are required to be found to join the major axis to the end points, and these are costed using a rectangle enclosing the relevant endpoint and a section of the major axis site, with a similar costing mechanism to step 3 above.

(5) If the steps 3 and 4 fail to find a solution then they can be retried choosing the minor axis of the diagonal for the first site.

(6) Any remaining gaps between the end points and the sites found are scheduled as extra (smaller) joins.

(7) Assignment of track positions within a site can be done so that tracks tend to pack against each other and thus eliminates wasted space that could only be recovered by "pushing" or by extensive rip up and reroute. This is aided by scheduling joins in order of length and packing consistently (to the left for vertical tracks and to the bottom for horizontal tracks, for instance).

This router expects to find single line-of-sight positions for tracks to cover one axis of each join.

Figure 7:
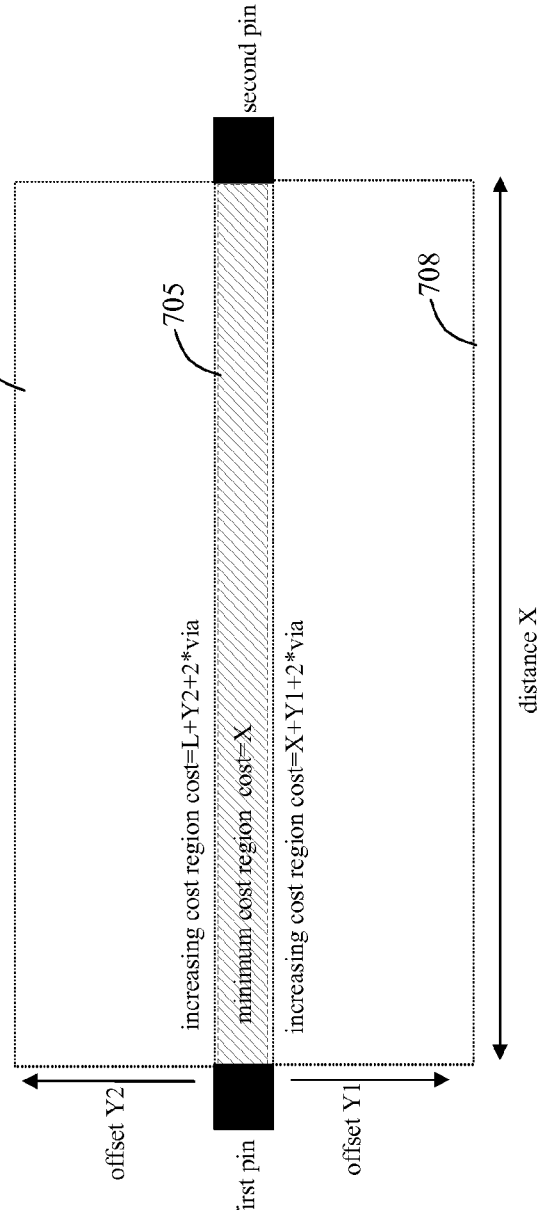
FIG. 7 shows routing for two pins together using a spine search.

FIG. 7 shows routing of two pins together using a spine search. This routing will make a join parallel to a basis direction. There is a first pin and a second pin, where there is a distance X between the pins. From a position of the first pin in a first direction, there is an offset Y1. From a position of the first pin in a second direction, opposite of the first direction, there is an offset Y2. The Y1 and Y2 directions are perpendicular to the X direction.

Region 705 is a minimum cost region where the cost of routing in this region is X. Region 708 is a first increasing cost region where the cost will be X+Y1+2*via. Region 711 is a second increasing cost region where the cost will be X+Y2+2*via.

Figure 8:
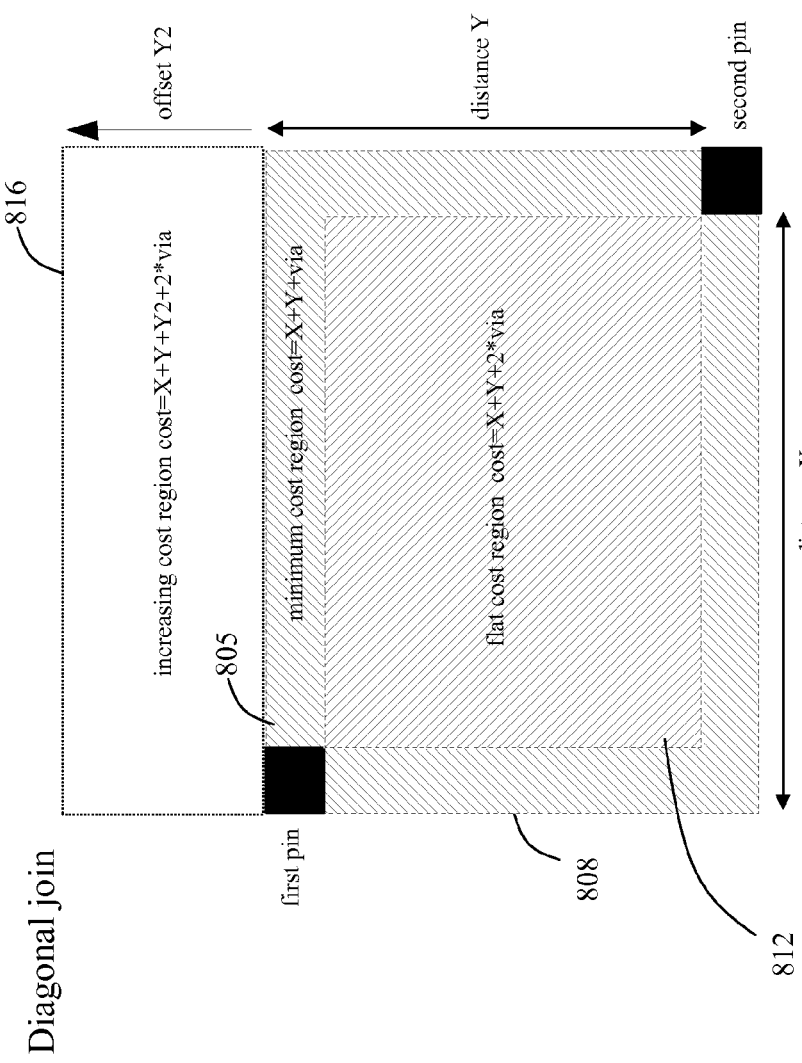
FIG. 8 shows a diagonal join of two pins.

FIG. 8 shows a diagonal join of two pins, a first pin and a second pin. There is a distance X and a distance Y, which are orthogonal. There is an offset Y2 which is in the Y direction. Region 805 and 808 are minimum cost regions where the cost will be X+Y+via. Region 812 is a flat cost region where the cost will be X+Y+2*via. And Region 816 is an increasing cost region where the cost will be X=Y+Y2+2*via.

Figure 9:
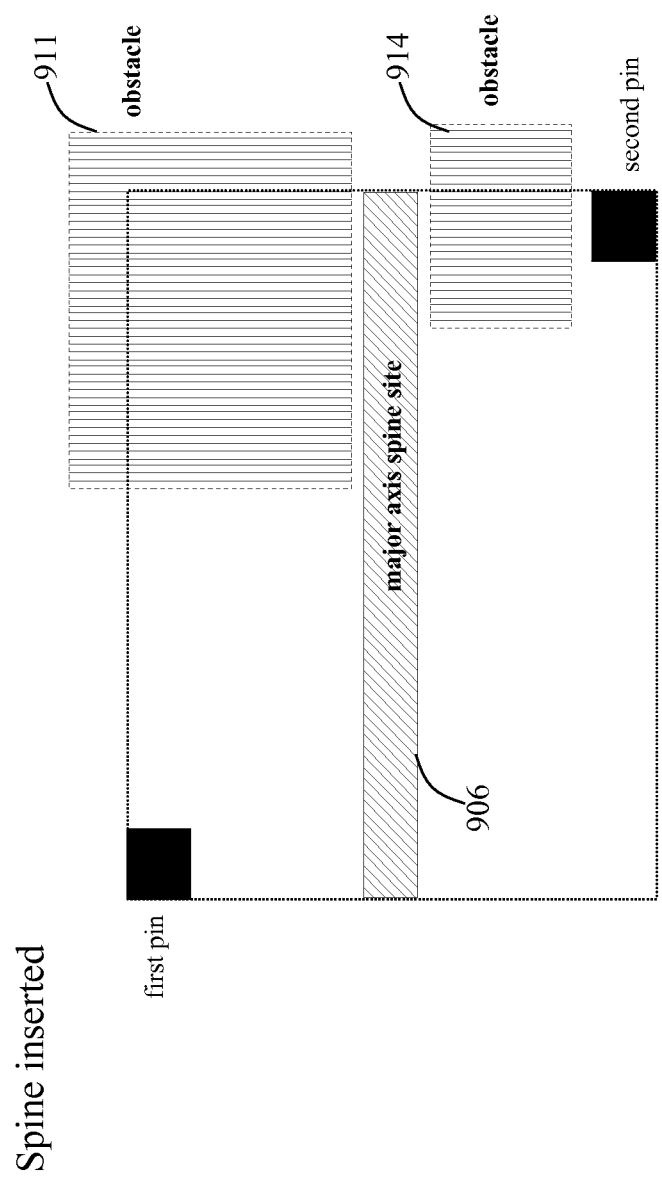
FIG. 9 shows an insertion of a spine.

FIG. 9 shows insertion of a major axis spine site 906. There are obstacles 911 and 914. The major axis spine runs between the obstacles as shown.

Figure 10:
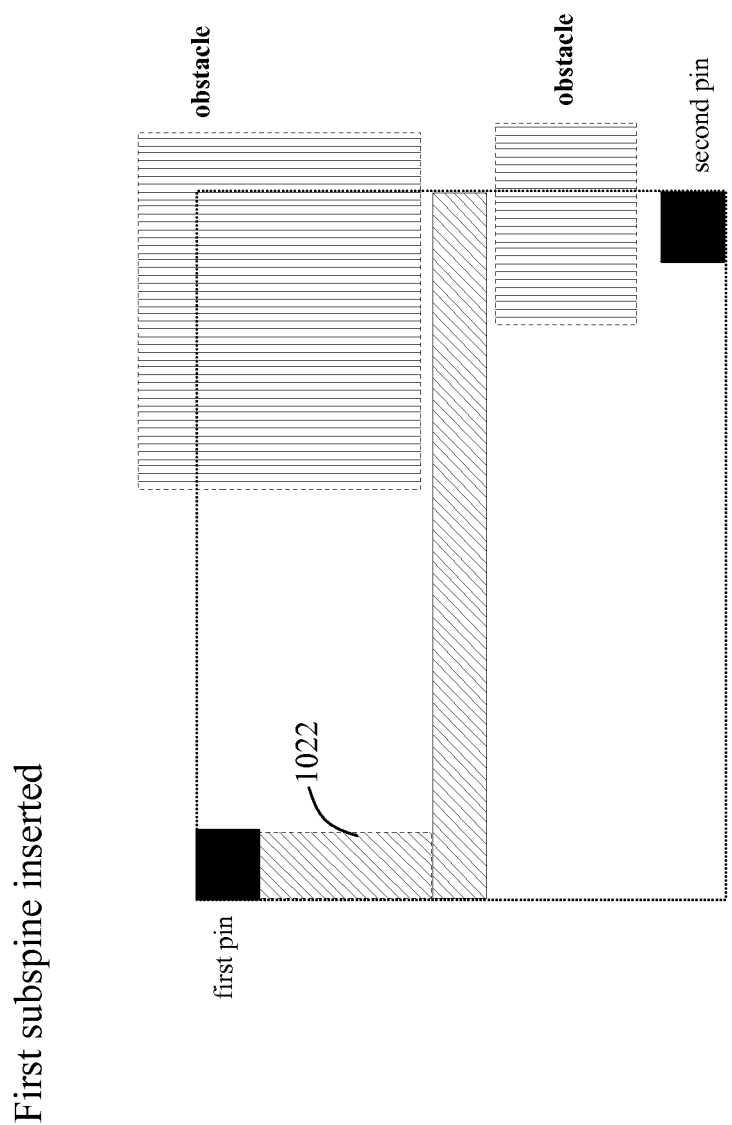
FIG. 10 shows an insertion of a first subspine.

FIG. 10 shows a first subspine 1022 is inserted.

Figure 11:
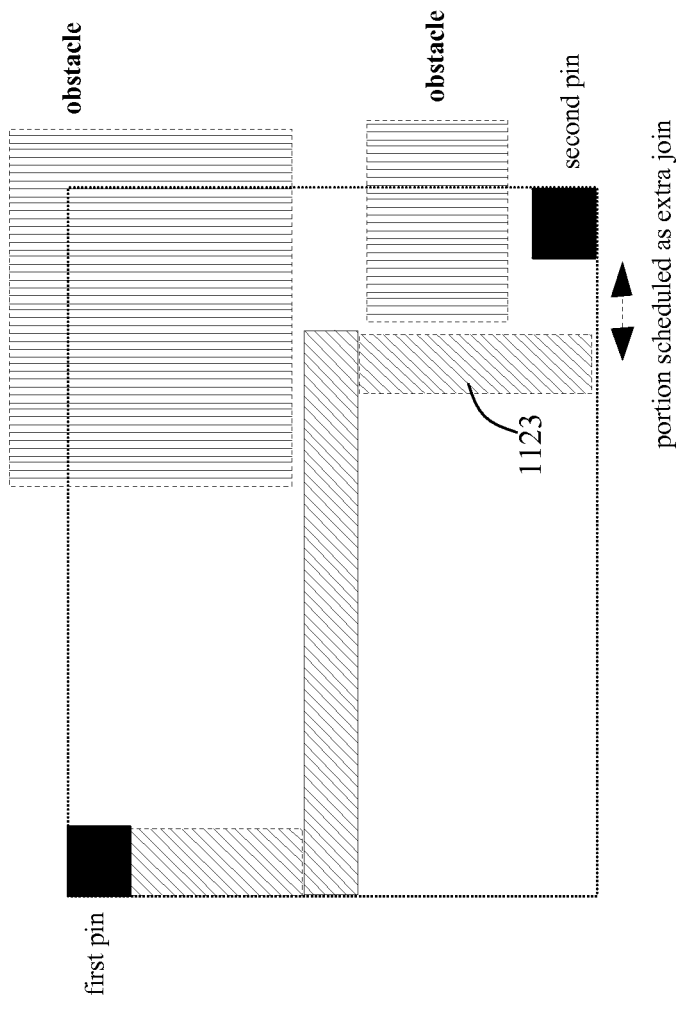
FIG. 11 shows an insertion of a second subspine.

FIG. 11 shows a second subspine 1123 is inserted.

In a specific embodiment, the invention provides a shape-based "join router" based on depth first flooding having the following flow. This is an embodiment of the join router. Either using conventional flooding (expansion and edges) or spine based, this can find solutions that do not make the "single line-of-sight" assumption.

(1) Starting from the start point, line or area of the join, this searches over a bounded rectangle (normally towards the end point) trying to find a maximal length spine that goes towards the endpoint whilst obeying all relevant rules.

(2) An initial site is created that covers the whole search rectangle.

(3) A search is made in the spatial tree that represents the design space, within the bounding box of all live sites.

(4) On encountering an object which is relevant, the illegal zone around that object is calculated and subtracted from the live sites in such a way as to either truncate them or to reduce them in width, any portion that would remain on the far side of the obstacle being discarded, as are any sites too narrow to contain the necessary tracks in a legal manner. Thus a single site will either be clipped back so far that it is discarded, OR it will be replaced by between 1 and 3 new sites, where one site may be clipped back by the obstacle and the other sites are narrower sites that go past the obstacle.

(5) The search zone is shrunk to only include the bounding box of the remaining live sites.

(6) The search continues (steps 4 to 6) until no further objects are found or no live sites remain.

(7) Remaining live sites are costed according to various factors, primarily how close they approach the desired end point, and the lowest cost site is chosen as the one to use.

(8) In the case of conventional flooding, the edge that was expanded to find this site is then split to represent the expanded and unexpanded portions of the edge (so later on another portion can be used if the chosen site fails to proceed in a satisfactory manner). The other edges of the site can be simply assigned and costed and thus used as potential places to start further expansions.

(9) In the case of spine based solutions a track is laid down in the chosen site, packed as previously described.

(10) For sections of routing that are against the layer bias, site finding is restricted to choose only sites that have been truncated by objects rather than ones that have passed by the objects but been thinned down. This can be a hard choice at step 4, or a costed option at step 7.

(11) In order to enhance performance, where the location of the start point (or an object at that point) is known in the spatial tree, then the search can be specialized so that it looks for objects in the same zone of the tree first, before searching larger subtrees, this increases the likelihood that the sites will be truncated by near neighboring objects quickly and reduces the number of objects that need to be considered in the search (because the search space shrinks as the sites get truncated).

(12) The search can be performed in a similar way to channel spine searching in that instead of searching the whole bounding box of all live sites it only searches the area of the currently lowest cost site but applies all found obstacles to all affected sites. This may reduce the number of objects that are considered and hence increase the performance.

The step 4 describes a controllable search which can substitute for the channel spine search (only find sites that cover the whole span), and can also perform breadth first searching (longest site that is the full starting width) and depth first searching (longest site that is at least minimum width).

Figure 12:
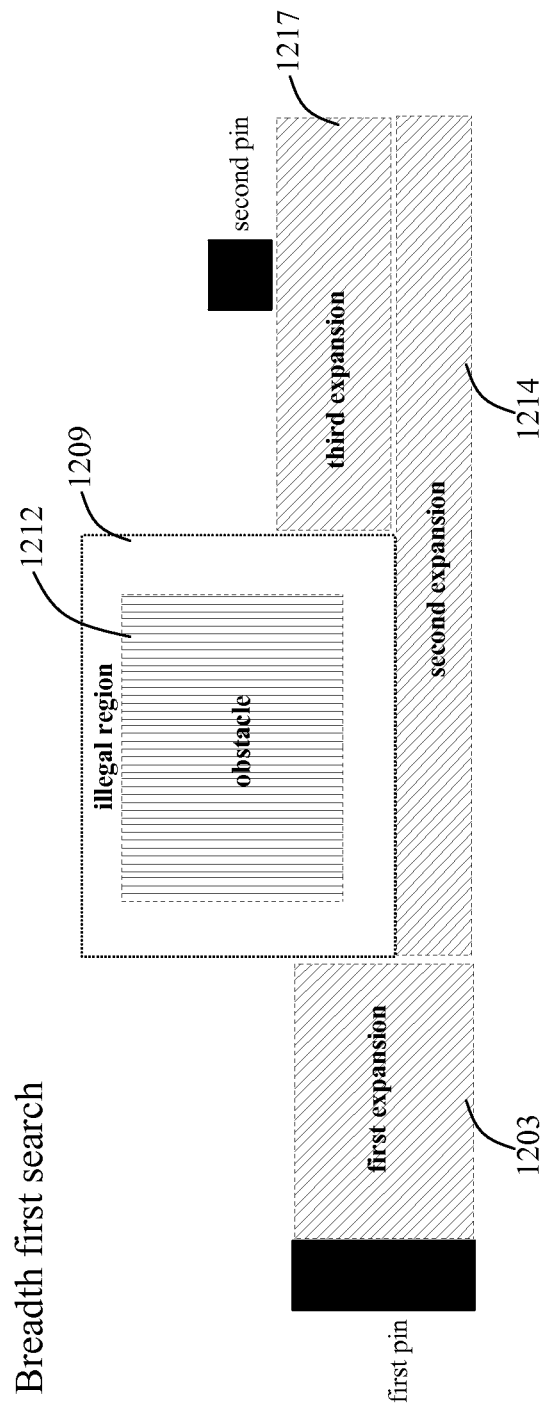
FIG. 12 shows a routing for two pins using a breadth first search.

FIG. 12 shows a routing for two pins using a breadth first search. There is a first expansion 1203 from a first pin to an illegal region 1209. The illegal region encloses an obstacle 1212. For example, the illegal region may be defined to be a region enclosing an obstacle plus a border distance. There is a second expansion 1214 extending from the first expansion to an edge of the bounding box (not shown). A third expansion 1217 extends from the first expansion to the second pin.

Figure 13:
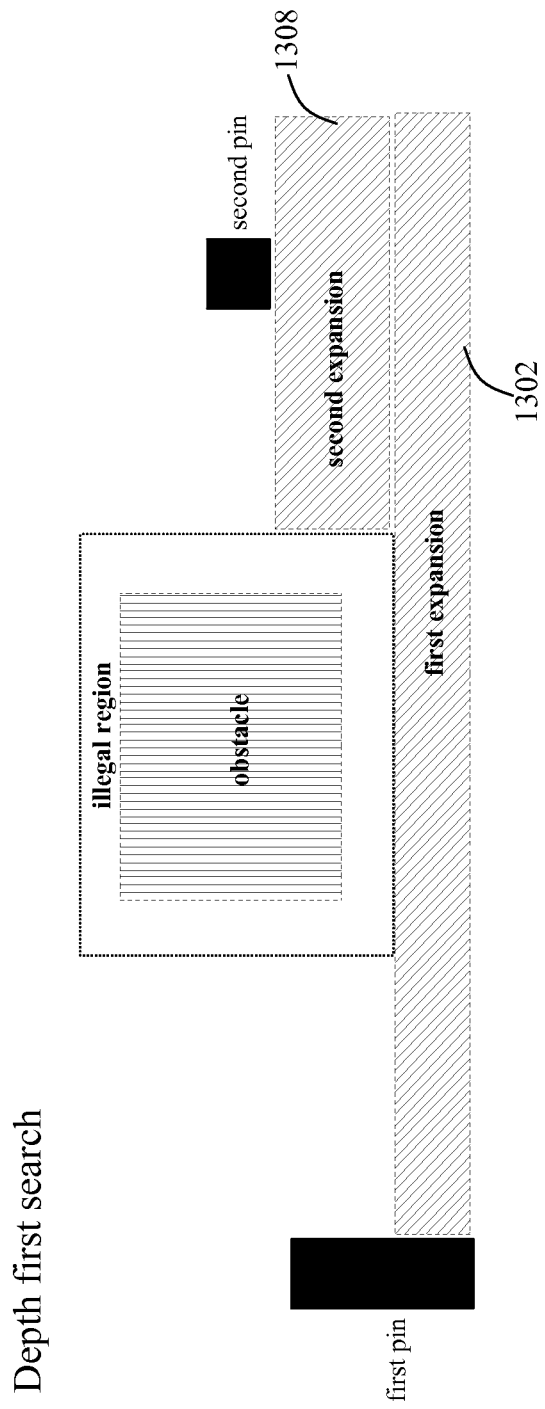
FIG. 13 shows a routing for two pins using a depth first search.

FIG. 13 shows a routing for two pins using a breadth first search. The layout of the first pin, second pin, obstacle, and illegal region is the same as in FIG. 12. There is a first expansion 1302 from the first pin to the edge of the bounding box (not shown). This a second expansion 1308 from the first expansion to the second pin.

Figure 14:
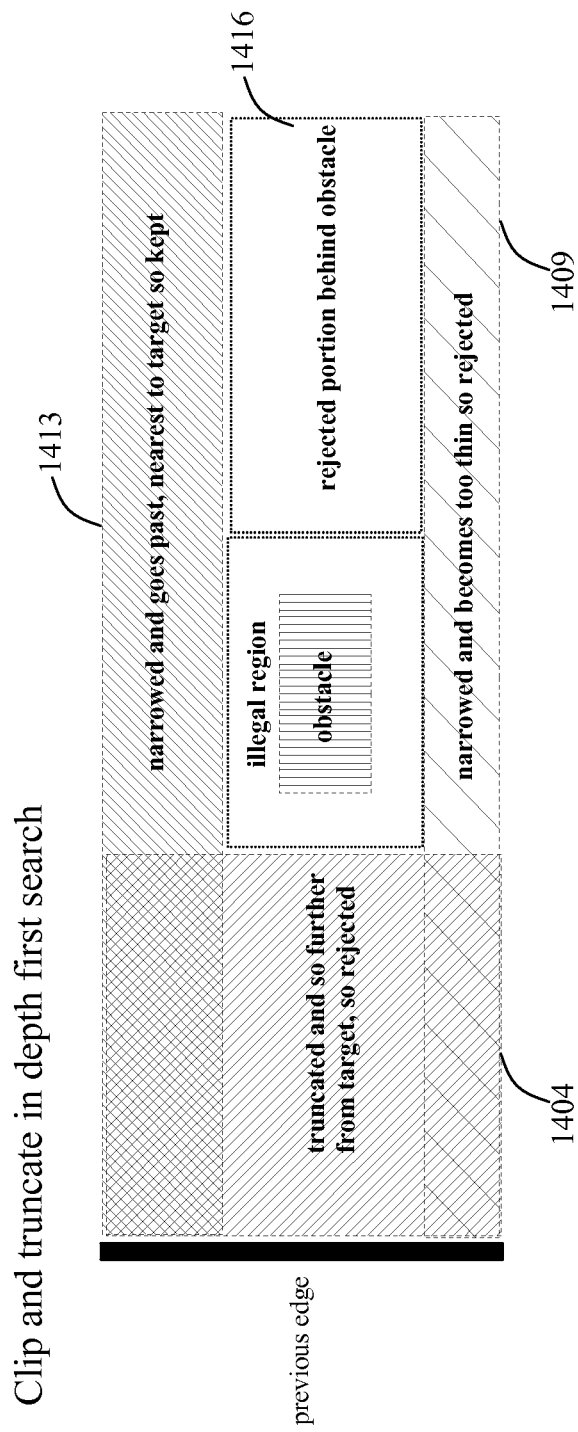
FIG. 14 shows a clip and truncate in a depth first search.

FIG. 14 shows a clip and truncate in depth first search. There is a previous edge from which the technique is trying to find an acceptable route. There is a region 1404 which is truncated at the illegal region, and so it is further from the target, so this region is rejected. There is a region 1409 which is narrowed and becomes too thin, so this region is rejected. There is a region 1413 which is narrowed and goes past the illegal region; this region is nearest the target, so this region is kept. There is a rejected portion 1415 which is behind the obstacle.

In a specific embodiment, the invention provides a shape based "join router" based on preflooding having the following flow. This is an embodiment of the join router.

(1) All objects in the design space are examined and the required spacing to them determined. Preinflated versions of these objects are stored in a spatial tree.

(2) An initial site is created covering the whole design space.

(3) Each preinflated object in the design space is in turn applied to the set of sites in such a way that the sites are split into legal areas for tracks with respect to that object. This will produce between zero and four new sites and remove the previous site. New sites are checked so that if they are enclosed by existing site then they are discarded, if they enclose an existing site then that one is discarded, if it extends an existing site along a whole edge then they are merged, and if they are too small to enclose tracks then they are discarded.

(4) The join router proceeds by first finding a site that overlaps (or is near to) the start point of the join, then finding what other sites overlap or abut that site either on the same layer or on other layers, costing each possibility including vias, length traveled, wrong way length, and so forth, and proceeding in a similar cost driven manner until the end point is reached.

(5) When the best set of sites has been found by the above procedure, tracks are laid down in such a way as to maximize the free space available (i.e., packing them) and achieve other quality measure such as minimizing wrong way routing, and then the overlapping sites are split by these new tracks in a method similar to step 3.

(6) To implement rules that vary by net class, the steps above can be repeated for each class in turn, changing the spacing rules used to match that class.

This mechanism largely eliminates the need to look at objects in the design space during routing, it only needs to choose between already identified open space. The neighbors of each piece of discovered open space can be determined and recorded, so no geographic search is required during the flooding stage. Furthermore, the relationships between the neighbors can be checked so that they abut sufficiently to allow for tracks and vias to go between them—only those abutments that are sufficiently wide are recorded. Furthermore, the set of open spaces that can be reached by traveling through such legal abutments form a set that might be termed an "ocean," and the set of spaces that must be used to join any two points must belong to the same ocean that those two points lie within. This can be used to accelerate the processing of the flood stage.

Figure 15:
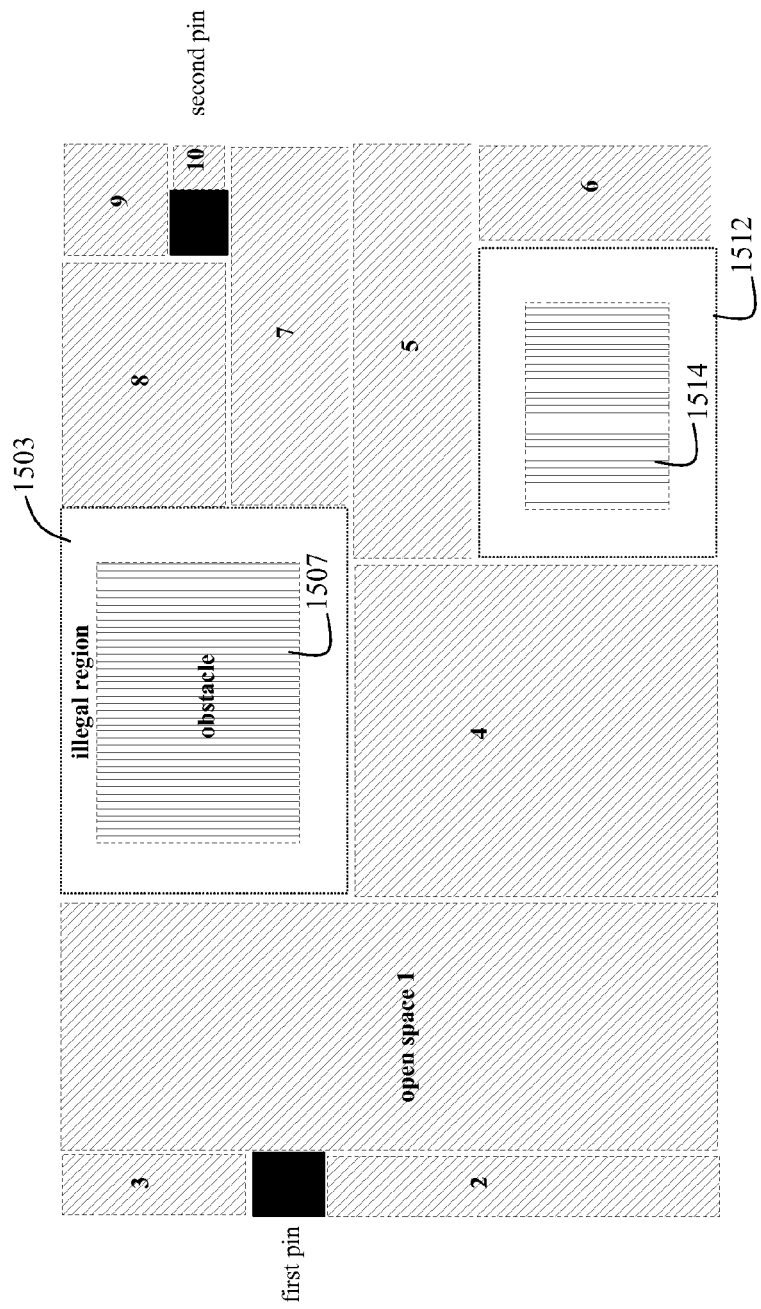
FIG. 15 shows analysis of open spaces for a space flood search.

FIG. 15 shows a routing for two pins using a space flood search. In this figure, the generation of open spaces are shown as nonoverlapping for clarity. There is a first pin, second pin, illegal region 1503 enclosing an obstacle 1507, and illegal region 1512 enclosing an obstacle 1514. There are ten open space regions number 1 to 10.

Figure 16:
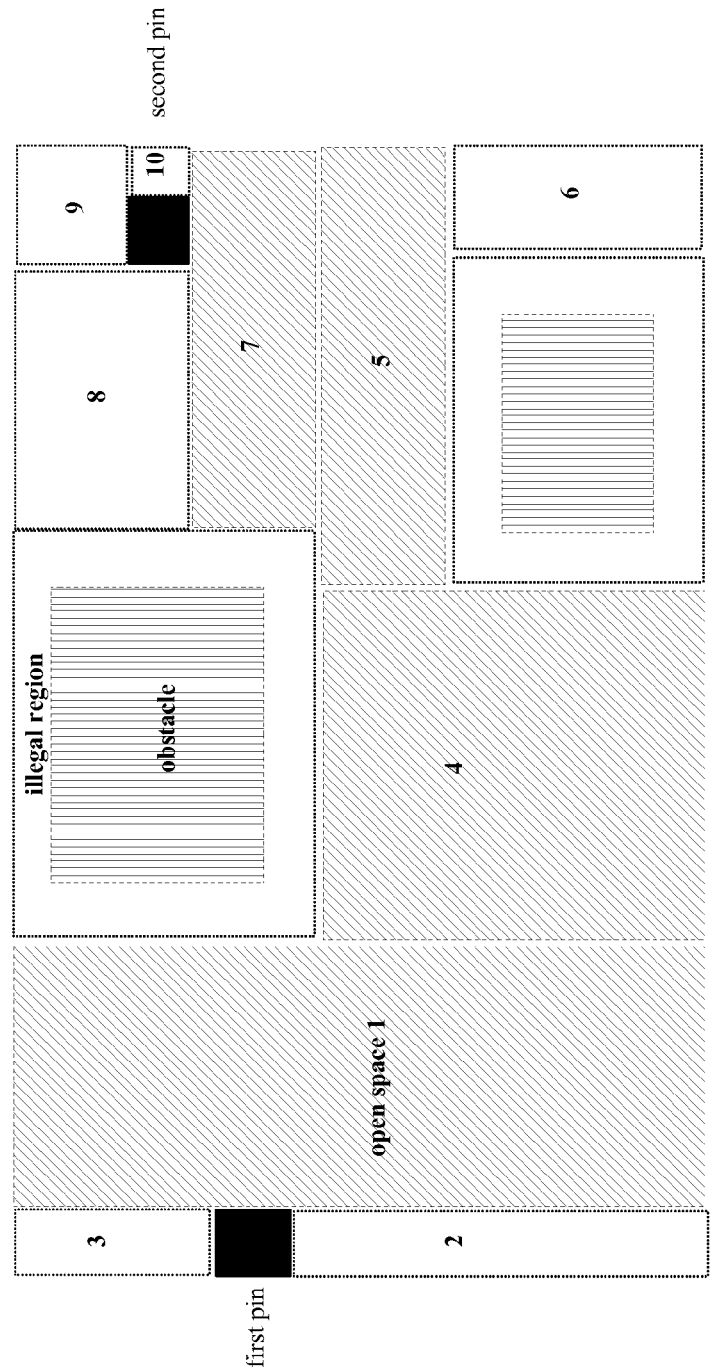
FIG. 16 shows a flooding through open spaces.

FIG. 16 shows flooding through open spaces. From the first pin to the second pin, flooding is through open spaces 1, 4, 5, and 7. Spaces 2, 3, 6, 8, 9, 10 are not flooded through.

Figure 17:
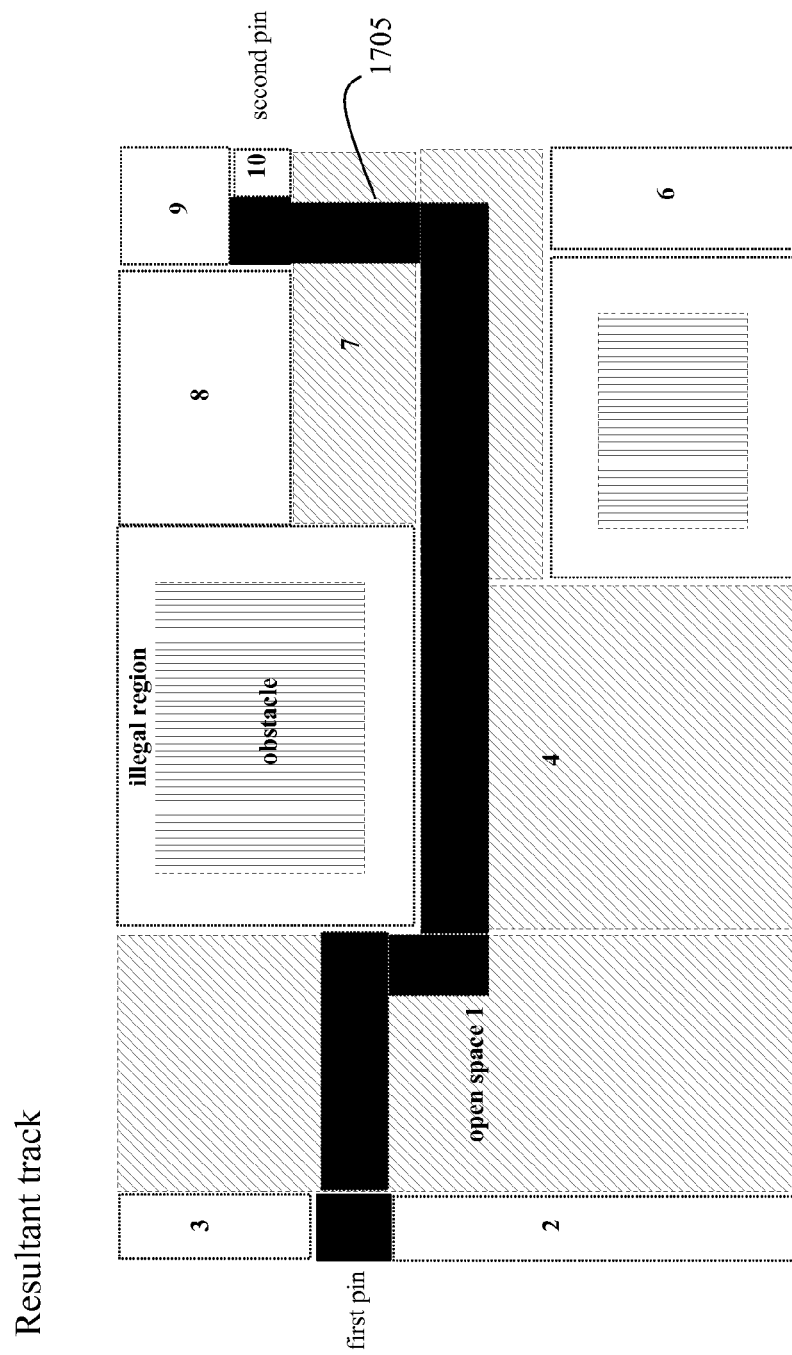
FIG. 17 shows a resultant track.

FIG. 17 shows a resultant track 1705 which goes through the open spaces 1, 4, 5, and 7. This track connects the first pin to the second pin.

Figure 18:
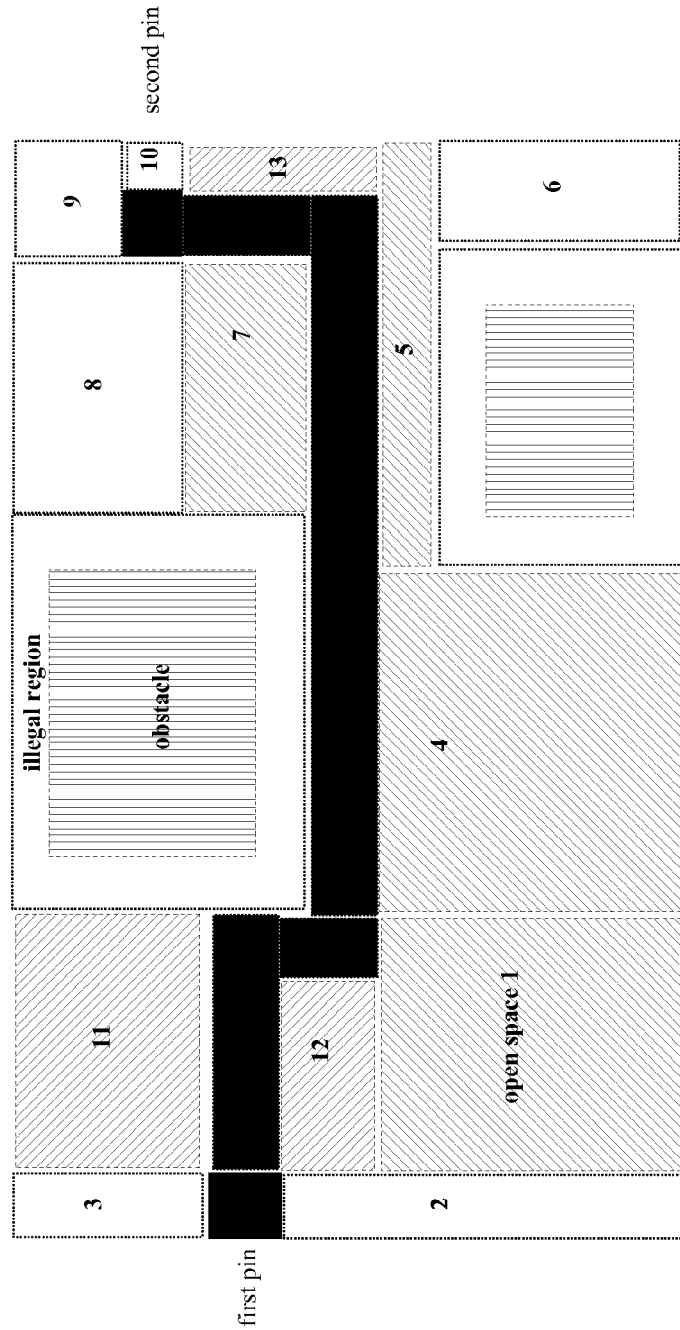
FIG. 18 shows clipped and split open spaces.

FIG. 18 shows clipped and split open spaces. Note that compared to the previous diagram, there are open spaces 11, 12, and 13. This is the result of clipping and splitting the open spaces.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
   establishing an initial structure for nets to be routed and placing of a Steiner point in the initial structure;
   ordering portions of the nets, wherein the ordering comprises:
      when n pins of a net are to be routed, where n is an integer two or greater, determining at least n−1 routing problems to be solved; and
      determining an order of solving the at least n−1 routing problems;
   based on the ordering, routing each part of the net using a spine routing search by using a computer, wherein as a result of the spine routing search, a first region within the initial structure is an increasing cost region and a second region within the initial structure is a minimum cost region, wherein the routing comprises:
      determining a spine segment for two pins to be routed; and
      connecting the two pins to the spine segment using two subspine segments, where the spine segment is longer than either of the two subspines segments; and
   for sections which fail or have an error, identifying a conflict and rerouting,
   wherein the ordering the nets or portions of the nets comprises:
      when an X-orientation section of a first one of the at least n−1 routing problems is longer than a second one of the at least n−1 routing problems, ordering the first one of the at least n−1 routing problems before the second one of the at least n−1 routing problems; and
      when an X-orientation section of a third one of the at least n−1 routing problems is longer than the second, but shorter than the first, ordering the third one of the at least n−1 routing problems after the first one of the at least n−1 routing problems, but before the second one of the at least n−1 routing problems,
   wherein the spine routing search is performed according the ordering.

2. The method of claim 1 wherein the determining an order of solving the at least n−1 routing problems comprises:
   sorting the at least n−1 routing problems according to distance in a first dimension; and
   solving one of the at least n−1 routing problems with a longest distance in the first dimension before other routing problems.

3. The method of claim 1 where a result of the routing each part of the net using a spine routing search is a route that comprises at most three segments to connect every two pins.

4. The method of claim 1 wherein the spine segment is on a first layer conductor and the subspine segments are on a second layer conductor, different from the first layer conductor.

5. The method of claim 4 wherein the spine segment is connected to subspine segments using vias.

6. The method of claim 1 wherein as a result of the spine routing search, a third region is a flat cost region.

7. The method of claim 6 wherein the second region is between the first and third regions.

8. The method of claim 6 wherein the second region borders four edges of the third region.

9. The method of claim 1 wherein as a result of the spine routing search, a third region is an increasing cost region, wherein cost increases differently than for the first region.

10. The method of claim 9 wherein the second region is between the first and third regions.

11. The method of claim 1 wherein n is at least 3.

12. A method comprising:
   establishing an initial structure for nets to be routed and placing of a Steiner point in the initial structure;
   ordering portions of the nets, wherein the ordering comprises:
      when n pins of a net are to be routed, where n is an integer two or greater, determining at least n−1 routing problems to be solved; and
      determining an order of solving the at least n−1 routing problems;
   based on the ordering, routing each part of the net using a spine routing search by using a computer, wherein as a result of the spine routing search, a first region within the initial structure is an increasing cost region and a second region within the initial structure is a minimum cost region, wherein the routing comprises:
   determining a spine segment for two pins to be routed; and
   connecting the two pins to the spine segment using two subspine segments, where the spine segment is longer than either of the two subspines segments; and
   for sections which fail or have an error, identifying a conflict and rerouting, wherein the ordering the nets or portions of the nets comprises:

when a length of a first one of the at least n−1 routing problems is longer than a second one of the at least n−1 routing problems, ordering the first one of the at least n−1 routing problems before the second one of the at least n−1 routing problems; and when a length of a third one of the at least n−1 routing problems is longer than the second, but shorter than the first, ordering the third one of the at least n−1 routing problems after the first one of the at least n−1 routing problems, but before the second one of the at least n−1 routing problems, wherein the spine routing search is performed according the ordering.

13. The method of claim 12 wherein the determining an order of solving the at least n−1 routing problems comprises:

sorting the at least n−1 routing problems according to distance in a first dimension; and solving one of the at least n−1 routing problems with a longest distance in the first dimension before other routing problems.

14. The method of claim 12 where a result of the routing each part of the net using a spine routing search is a route that comprises at most three segments to connect every two pins.

15. The method of claim 12 wherein the spine segment is on a first layer conductor and the subspine segments are on a second layer conductor, different from the first layer conductor.

16. The method of claim 12 wherein as a result of the spine routing search, a third region is a flat cost region.

17. The method of claim 16 wherein the second region is between the first and third regions.

18. The method of claim 16 wherein the second region borders four edges of the third region.

19. The method of claim 12 wherein as a result of the spine routing search, a third region is an increasing cost region, wherein cost increases differently than for the first region.

20. The method of claim 19 wherein the second region is between the first and third regions.

21. The method of claim 12 wherein n is at least 3.

22. A method comprising:

establishing an initial structure for nets to be routed and placing of a Steiner point in the initial structure;

ordering portions of the nets, wherein the ordering comprises:

when n pins of a net are to be routed, where n is an integer two or greater, determining at least n−1 routing problems to be solved; and determining an order of solving the at least n−1 routing problems;

based on the ordering, routing each part of the net using a spine routing search by using a computer, wherein as a result of the spine routing search, a first region within the initial structure is an increasing cost region and a second region within the initial structure is a minimum cost region, wherein the routing comprises:

determining a spine segment for two pins to be routed; and connecting the two pins to the spine segment using two subspine segments, where the spine segment is longer than either of the two subspines segments; and for sections which fail or have an error, identifying a conflict and rerouting, wherein the ordering the nets or portions of the nets comprises:

when a dimension of a bounding box for a first one of the at least n−1 routing problems is larger than for a second one of the at least n−1 routing problems, ordering the first one of the at least n−1 routing problems before the second one of the at least n−1 routing problems; and when a dimension of a bounding box for a third one of the at least n−1 routing problems is larger than for the second, but smaller than for the first, ordering the third one of the at least n−1 routing problems after the first one of the at least n−1 routing problems, but before the second one of the at least n−1 routing problems, wherein the spine routing search is performed according the ordering.

23. The method of claim 22 wherein the determining an order of solving the at least n−1 routing problems comprises:

sorting the at least n−1 routing problems according to distance in a first dimension; and solving one of the at least n−1 routing problems with a longest distance in the first dimension before other routing problems.

24. The method of claim 22 where a result of the routing each part of the net using a spine routing search is a route that comprises at most three segments to connect every two pins.

25. The method of claim 22 wherein the spine segment is on a first layer conductor and the subspine segments are on a second layer conductor, different from the first layer conductor.

26. The method of claim 22 wherein as a result of the spine routing search, a third region is a flat cost region.

27. The method of claim 26 wherein the second region is between the first and third regions.

28. The method of claim 26 wherein the second region borders four edges of the third region.

29. The method of claim 22 wherein as a result of the spine routing search, a third region is an increasing cost region, wherein cost increases differently than for the first region.

30. The method of claim 29 wherein the second region is between the first and third regions.

31. The method of claim 22 wherein n is at least 3.

* * * * *